United States Patent
Chung et al.

[11] Patent Number: 6,153,360
[45] Date of Patent: *Nov. 28, 2000

[54] METHOD OF REMOVING PHOTO-RESIST

[75] Inventors: Army Chung, Hsinchu; Hsi-Hsin Hong, Nantou Hsien; Chi-Fa Ku, Kaohsiung Hsien, all of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/010,682

[22] Filed: Jan. 22, 1998

[30] Foreign Application Priority Data

Dec. 24, 1997 [TW] Taiwan .................................. 86119669

[51] Int. Cl.⁷ .......................................................... G03C 5/00
[52] U.S. Cl. .............................. 430/331; 134/38; 510/176
[58] Field of Search .......................... 430/331; 510/176, 510/201, 206; 134/38

[56] References Cited

U.S. PATENT DOCUMENTS

| | | | |
|---|---|---|---|
| 4,965,010 | 10/1990 | Swett | 252/170 |
| 4,992,108 | 2/1991 | Ward et al. | 134/38 |
| 5,091,103 | 2/1992 | Dean et al. | 252/162 |
| 5,155,175 | 10/1992 | Mercer et al. | 525/390 |
| 5,171,393 | 12/1992 | Moffat | 156/345 |
| 5,268,260 | 12/1993 | Bantu et al. | 430/325 |
| 5,626,913 | 5/1997 | Tomoeda et al. | 427/299 |
| 5,728,664 | 3/1998 | Michelotti | 510/176 |
| 5,997,658 | 12/1999 | Peters et al. | 134/38 |

OTHER PUBLICATIONS

McGraw–Hill Dictionary of Chemistry, 1997, McGraw–Hill, NY, p. 173.

*Primary Examiner*—Janet Baxter
*Assistant Examiner*—Rosemary Ashton
*Attorney, Agent, or Firm*—Rabin & Champagne PC

[57] ABSTRACT

A method of removing photo-resist. Acetone, thinner, and deionized water for scrubbing a wafer are used to clean a wafer on which a photo-resist layer is formed, so that thinner and deionized water are mutually dissolvable with acetone as medium. The photo-resist layer is then removed.

9 Claims, 2 Drawing Sheets

METHOD OF REMOVING PHOTO-RESIST

CROSS-REFERENCE TO RELATED APPLICATION

This application claims the priority benefit of Taiwan application Ser. No. 86119669, filed Dec. 24, 1997, the full disclosure of which is incorporated herein by reference.

BACKGROUND OF THE INVENTION

1 Field of the Invention

The invention relates to a method of removing a photo-resist, and more particularly to a gradient elution method of removing photo-resist without moving to another region other than the current processing region.

2 Description of the Related Art

The process of fabricating an IC is very complex. Hundreds of steps are needed for making an IC. The fabrication normally takes one or two months to complete. The IC industry is a high technology industry including four main branches: IC design, wafer fabrication, wafer testing, and wafer packaging.

For example, the main purpose for the process of development is to clean the exposed part of photo-resist layer by chemical reaction, and to develop the transferred pattern.

There are many methods to perform a development process. For a commercial in-line operation, a "spray/puddle" method is normally adapted. The "spray/puddle" method comprises three steps. Firstly, developer is sprayed onto a wafer deposed on a spinner. Secondly, the wafer is puddle developed in a stationary status. Thirdly, after cleaning by water, the wafer is spun dry.

The next step after development is, before performing photolithography, to perform a quality control step, that is, an "after inspection (ADI)" step. The ADI step is to ensure the accuracy after the subsequent photolithography process. Thus, any abnormal state or condition can be found and reworked before the whole wafer is damaged in the subsequent process.

During photolithography, such as forming photo-resist, exposure, bake, or development, or before curing by ultra-violet and performing plasma bombardment, if a fault is found, the photo-resist has to be removed and reworked to avoid further damage. In the conventional semiconductor process, the process region of removing photo-resist and the processing region of photolithography are separate. Therefore, if a fault is found during fabrication, the photo-resist has to be removed in a region of removing photo-resist. The removal of photo-resist can not be performed in the processing region of photolithography, and thus, consumes a long fabricating time.

One of the conventional methods to remove photo-resist is to use an organic solution. The bonding of the photo-resist is destroyed by and dissolved in the organic solution. Normally, groups of acetone and aromatic base are used as the organic solution for removing photo-resist. In addition, photo-resist is an organic compound composed of carbon and hydrogen element. Therefore, an inorganic solution such as sulfuric acid ($H_2SO_4$) and perhydrol ($H_2O_2$), can be used to oxidise the carbon element into carbon dioxide ($CO_2$) by perhydrol and to remove the hydrogen element by dehydration of sulfuric acid. Another method to remove photo-resist is by plasma.

Though several methods are available to remove photo-resist in a conventional process, almost all the removal regions of photo-resist are separated from the processing region of photo-lithography. Therefore, during processing, the faulty wafers have to be moved from the current processing region to the removal region of photo-resist for rework.

SUMMARY OF THE INVENTION

It is therefore an object of the invention to provide a method of removing photo-resist. The photo-resist is removed in the current processing region without being moved to another region.

It is therefore another object of the invention to provide a method of removing photo-resist. Acetone is used as a medium, so that N-methyl-pyrrolidone (NMP) and deionized water are mutually dissolvable, and the photo-resist on the wafer is removed by a gradient elution method.

To achieve these objects and advantages, and in accordance with the purpose of the invention, as embodied and broadly described herein, the invention is directed towards a method of removing photo-resist. Acetone, thinner, and deionized water for scrubbing a wafer are used to clean a wafer on which a photo-resist layer is formed, so that thinner and deionized water are mutually dissolvable with acetone as the medium. The photo-resist layer is then removed.

It is to be understood that both the foregoing general description and the following detailed description are exemplary and explanatory only and are not restrictive of the invention, as claimed.

DESCRIPTION OF THE PREFERRED EMBODIMENTS

Figure 1:
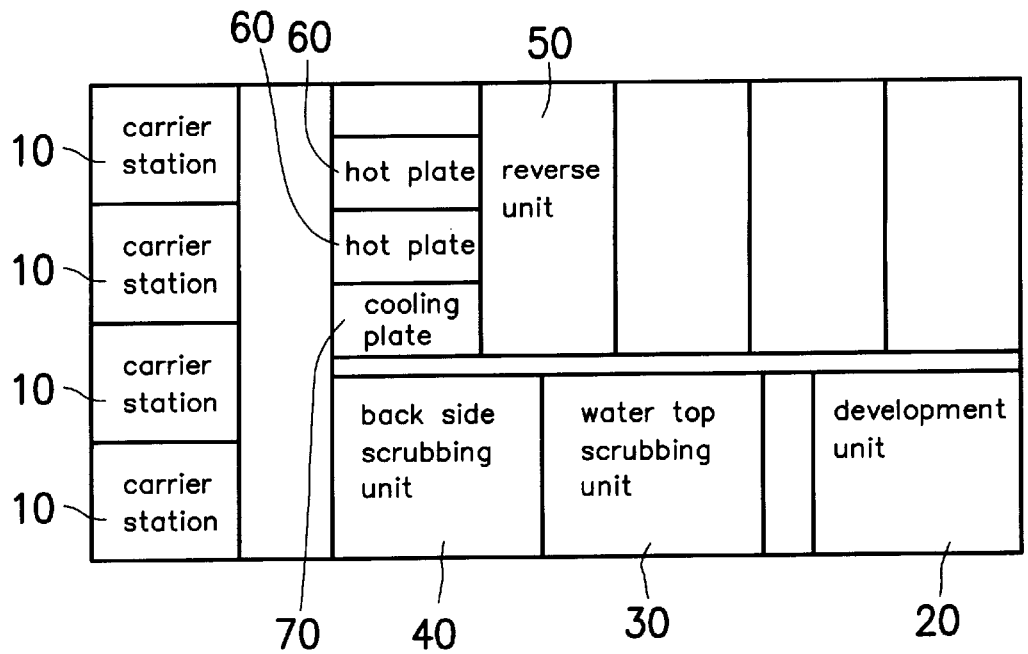
FIG. 1 shows a configuration of an apparatus for removing photo-resist in a preferred embodiment according to the invention.

Referring to FIG. 1, an apparatus for removing photo-resist in a preferred embodiment according to the invention is shown. The apparatus for removing photo-resist comprises four carrier stations 10 for wafer carrying, a development unit 20 to develop or remove photo-resist on the wafer, a top scrubbing unit 30 to clean the top side of the wafer, a reverse unit 50 to turn over the wafer for cleaning the opposite side, a back scrubbing unit 40 to clean the back side of the wafer, two hot plate to remove the residue solvent on the wafer, and a cooling plate to cool down the temperature of the wafer.

Figure 2:
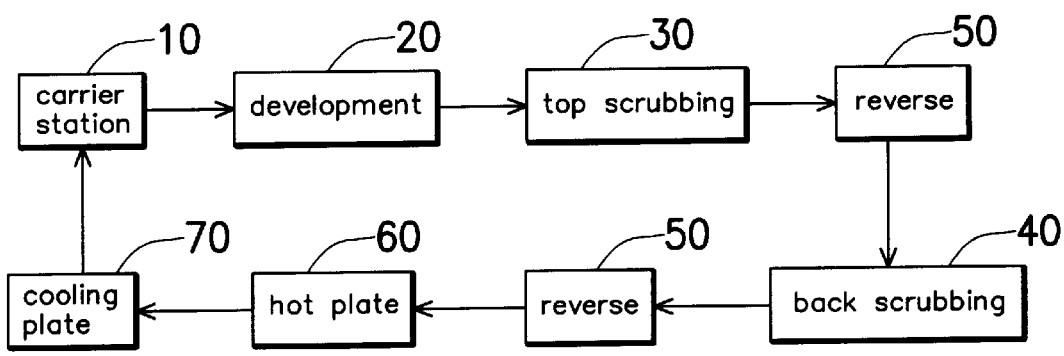
FIG. 2 is a flow chart of for removing photo-resist using the apparatus shown on FIG. 1.

Referring FIG. 1 and FIG. 2, an apparatus, and by which the operation flow of removing photo-resist are shown. A wafer is deposed on one of the carriers 10. The wafer is then delivered to the development unit 20. After development and removal of photo-resist, the wafer is delivered to the top scrubbing unit 30 for top side scrubbing and cleaning. Through the reverse unit 50, the wafer is turned over for the preparation of back side scrubbing and cleaning. The wafer is delivered to the back scrubbing unit 40 for back side cleaning. After the cleaning steps, the wafer is delivered on one of the hot plates 60 to remove the residue solvent on the wafer, and then to a cooling plate 70 to decrease the temperature of the wafer. The wafer is then delivered back to the carrier 10.

Figure 3:
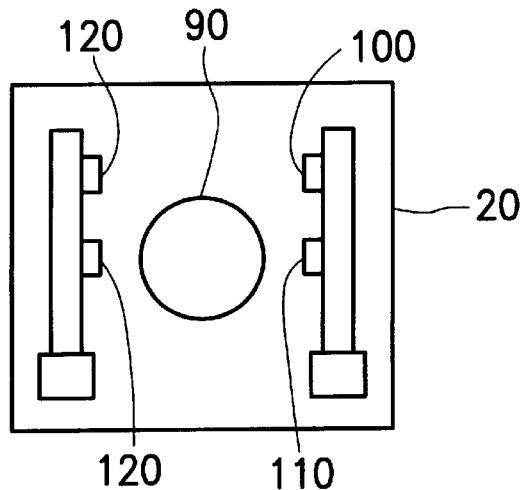
FIG. 3 shows the configuration of the development unit in the apparatus shown on FIG. 1.

Referring to FIG. 3, a detailed configuration of development unit 20 in the above apparatus is shown. The development unit 20 comprises a wafer processing region 90 as a region for wafer spray/puddle, a first nozzle 100 to spray thinner, a (backup) second nozzle 110 to spray developer, and a third nozzle 120 to spray acetone.

The thinner mentioned above is NMP, or a material with less polarity, for example, pyrrolidone, pyridine ($C_5H_5N$), or aromatic organic solvent. An organic solvent such as ketone or alcohol solvent with a higher polarity can be used instead of acetone. By using the acetone spray, (or the ketone or the alcohol solvent with the high polarity), the NMP is dissolvable in deionized water, and therefore, the residue solvent on the wafer can be removed.

Figure 4:
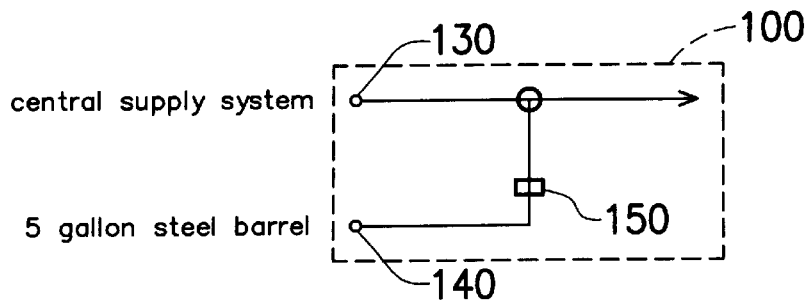
FIG. 4 shows the internal structure of a spray in the apparatus shown on FIG. 1.

Referring to FIG. 3 and FIG. 4, thinner sprayed from the first nozzle 100 is supplied by the central supply system 130 and a five gallon steel barrel 140. If thinner supplied by the central supply system 130 is all consumed, a switch 150 is open to continuously supply thinner from the steel barrel 140.

Figure 5:
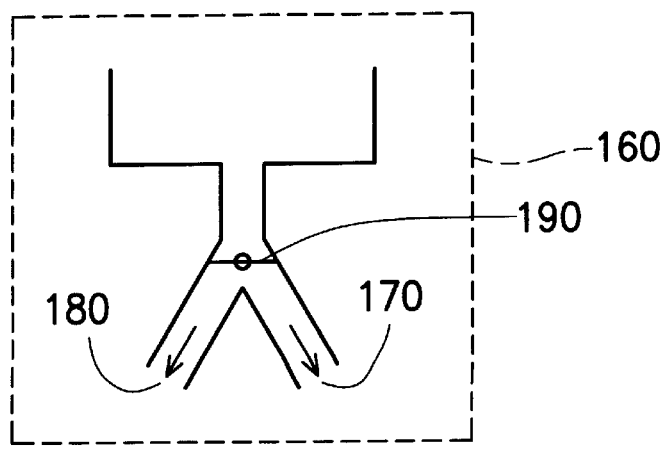
FIG. 5 shows the configuration of a recycling unit.

Referring to FIG. 3 and FIG. 5, after the wafer is processed in the wafer processing region 90, solvent is recycled by the recycling unit 160. If developer flows out from the first trench 170, thinner flows from the second trench 180. The flow of developer and thinner is controlled by a diverter 190.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of removing photo-resist, comprising:

performing a method to scrub a wafer on which a photo-resist is formed, by applying acetone and thinner, the acetone acting as a medium so that the thinner is mutually dissolvable with deionized water, and applying deionized water; and removing the photo-resist layer, wherein N-methyl-pyrrolidone solvent is used as the thinner.

2. The method according to claim 1, wherein the performing operation and the removing operation are performed in a developing unit in which the photo-resist layer is developed on the wafer.

3. The method according to claim 2, wherein the developing unit includes a wafer processing region;

wherein the photo-resist layer is developed by placing the wafer onto a spinner disposed in the wafer processing region, spraying a developer onto the wafer, and spinning the wafer; and wherein the performing operation and the removing operation are performed without moving the wafer from the wafer processing region.

4. A method of removing photo-resist, comprising:

performing a method to scrub a wafer on which a photo-resist is formed, by applying acetone and thinner, the acetone acting as a medium so that the thinner is mutually dissolvable with deionized water, and applying deionized water; and removing the photo-resist layer, wherein pyrrolidone solvent is used as the thinner.

5. The method according to claim 4, wherein the performing operation and the removing operation are performed in a developing unit in which the photo-resist layer is developed on the wafer.

6. The method according to claim 5, wherein the developing unit includes a wafer processing region;

wherein the photo-resist layer is developed by placing the wafer onto a spinner disposed in the wafer processing region, spraying a developer onto the wafer, and spinning the wafer; and wherein the performing operation and the removing operation are performed without moving the wafer from the wafer processing region.

7. A method of removing photo-resist, comprising:

performing a method to scrub a wafer on which a photo-resist is formed, by applying acetone and thinner, the acetone acting as a medium so that the thinner is mutually dissolvable with deionized water, and applying deionized water; and removing the photo-resist layer, wherein pyridine solvent is used as the thinner.

8. The method according to claim 7, wherein the performing operation and the removing operation are performed in a developing unit in which the photo-resist layer is developed on the wafer.

9. The method according to claim 8, wherein the developing unit includes a wafer processing region;

wherein the photo-resist layer is developed by placing the wafer onto a spinner disposed in the wafer processing region, spraying a developer onto the wafer, and spinning the wafer; and wherein the performing operation and the removing operation are performed without moving the wafer from the wafer processing region.

* * * * *